United States Patent [19]

Macdougall et al.

[11] Patent Number: 4,612,563
[45] Date of Patent: Sep. 16, 1986

[54] HIGH VOLTAGE INTEGRATED CIRCUIT

[75] Inventors: John D. Macdougall, Westboro; Richard B. Cooper, Shrewsbury, both of Mass.

[73] Assignee: Sprague Electric Company, North Adams, Mass.

[21] Appl. No.: 635,878

[22] Filed: Jul. 30, 1984

[51] Int. Cl.$^4$ ............... H01L 27/02; H01L 29/34
[52] U.S. Cl. .................................. 357/40; 357/51; 357/54
[58] Field of Search ............... 357/41, 40, 36, 43, 357/54, 51

[56] References Cited

U.S. PATENT DOCUMENTS

| | | | |
|---|---|---|---|
| 3,602,782 | 8/1971 | Klein | 357/40 |
| 3,841,926 | 10/1974 | Garnache et al. | 148/188 |
| 4,001,869 | 1/1977 | Brown | 357/54 X |
| 4,256,515 | 3/1981 | Miles et al. | 148/1.5 |
| 4,513,304 | 4/1985 | Takemae | 357/41 X |

OTHER PUBLICATIONS

Antipov, IBM Technical Disclosure Bulletin, vol. 17, No. 1, Jun. 1974, pp. 102-103.

Primary Examiner—Martin H. Edlow
Assistant Examiner—Terri M. Henn

[57] ABSTRACT

High voltage integrated circuit field plates that are connected directly to the epitaxial pockets over which they lie, are formed simultaneously with high resistivity polysilicon resistors and are insulated from cross-over metal by a dual insulation of silicon dioxide and silicon nitride. Without adding to these process steps, MNS capacitors are formed that have a higher packing density than their MOS counterparts. The space saving MNS capacitors are thus space-wise and process-wise compatible with the polysilicon field plates that occupy much less chip real estate than do diffused channel stops.

11 Claims, 2 Drawing Figures

HIGH VOLTAGE INTEGRATED CIRCUIT

BACKGROUND OF THE INVENTION

This invention relates to high voltage integrated circuits and more particularly to integrated circuit polysilicon field plates that are formed simultaneously with polysilicon resistors, both of which are insulated from high voltage metal crossovers.

Linear high voltage circuits are used in the telecommunications industry. In central office telephone exchanges the voltage is typically 70 volts. Such circuits include RC frequency-discriminating filters.

Integrated circuits for such applications must employ high voltage transistors and be constructed to avoid silicon surface inversions under high voltage conductors. Guard rings or the more space conserving field plates prevent such unwanted inversion.

Polysilicon resistors capable of high voltage operation are typically formed on an integrated circuit over a protective silicon dioxide layer. A description of such resistors and a method for making them is found in the patent to Miles et al, U.S. Pat. No. 4,256,515, issued March 17, 1981 and assigned to the same assignee as is the present invention. Such resistors are desirably made of thin high resistivity polysilicon strips.

Heavily-doped, low-resistivity polysilicon field plates are known for preventing inversion of the semiconducting regions between low voltage field effect transistors in a common pocket, e.g. in a memory array. Such field plates are made highly conductive by heavily doping them with impurities.

High voltage integrated circuits have employed highly conductive metal field plates surrounding a PN junction at the surface of the chip to expand the depletion region there and increase the breakdown voltage at that surface. Such field plates are typically connected electrically to the underlying doped region that is surrounded.

It is an object of this invention to provide a high density high voltage integrated circuit.

It is a further object of this invention to provide such an integrated circuit having polysilicon resistors and polysilicon field plates having identical thicknesses and identical dopant profiles that may be made by the same process steps at the same time.

It is another object of this invention to provide such an integrated circuit having a double insulating layer of silicon dioxide over the polysilicon field plates and resistors that in turn may be crossed by high voltage metal runs.

It is yet another object of this invention to provide such an integrated circuit that includes space conserving MNS capacitors for use in on-board filters wherein the nitride dielectric may be formed simultaneously with the nitride in the dual insultion covering the polysilicon.

SUMMARY OF THE INVENTION

A high voltage integrated circuit is comprised of a single crystal silicon substrate of P-type with an N-type epitaxial layer that is divided by P-type isolation walls into a plurality of pockets. In one of the pockets there is formed a component, such as a diffused resistor, a PNP transistor or an NPN transistor, that includes a mildly doped P-type region such as an NPN base region. A first silicon dioxide layer covers the epitaxial layer surface.

A doped high resistivity polysilicon strip is positioned on the first silicon dioxide layer just inside the isolation-wall portion that encircles the one epitaxial pocket, and a polysilicon resistor strip having the very same high sheet resistivity and dopant profile is positioned on another surface area portion of the first silicon dioxide layer.

A second silicon dioxide layer covers the polysilicon field plate and resistor, and a silicon nitride layer covers the second silicon dioxide layer so as to form a dual insulation layer over these polysilicon parts.

Metal film conductors contact at least the mildly doped P-type region, e.g. a lateral PNP collector region at the base of an NPN transistor and may contact other regions within the one pocket. These metal films extend outwardly over the dual insulation covering the polysilicon field plate and may of course cross the dual insulation of the polysilicon resistor as well. In any case, the dual high voltage insulation admits of high voltage resistor crossovers by other metal runs contributing further to a high circuit density chip.

One metal film contacts the N-type epitaxial material itself of the one pocket and extends outwardly to overlie and contact the polysilicon field plate through a hole in the dual insulation over the polysilicon field plate. This unique field plate is thus always at epitaxial pocket potential which prevents the establishment of either depletion or enhancement fields in the epitaxial pocket surface directly underneath the field plate. Such undesirable fields are generated by high voltage conductors that pass over the epitaxial surface.

A space-efficient metal-nitride-semiconductor (MNS) capacitor may advantageously be formed either over the one pocket, or another pocket, without any additional process steps.

In the method for making this integrated circuit, conductivity-imbuing dopants are simultaneously in one step introduced into the polysilicon field plate and resistor. Preferably the dopants are ion implanted to extend only part way into the polysilicon material to obtain a highly predictable sheet resistivity leading to small tight tolerance resistors. The laminar construction and high resistivity feature of the field plate is a direct result of its having been made simultaneously formed with the laminar high resistivity resistor to save process steps.

It is also preferred to first form the polysilicon layer over the entire surface of the first silicon dioxide layer, execute the ion implantation step and then remove portions of the polysilicon layer to define the resistor (s) and field plate (s). In that way the entire chip surface is shielded from the ion beam during ion implantation, obviating additional masking steps.

DESCRIPTION OF THE PREFERRED EMBODIMENTS

Figure 1:
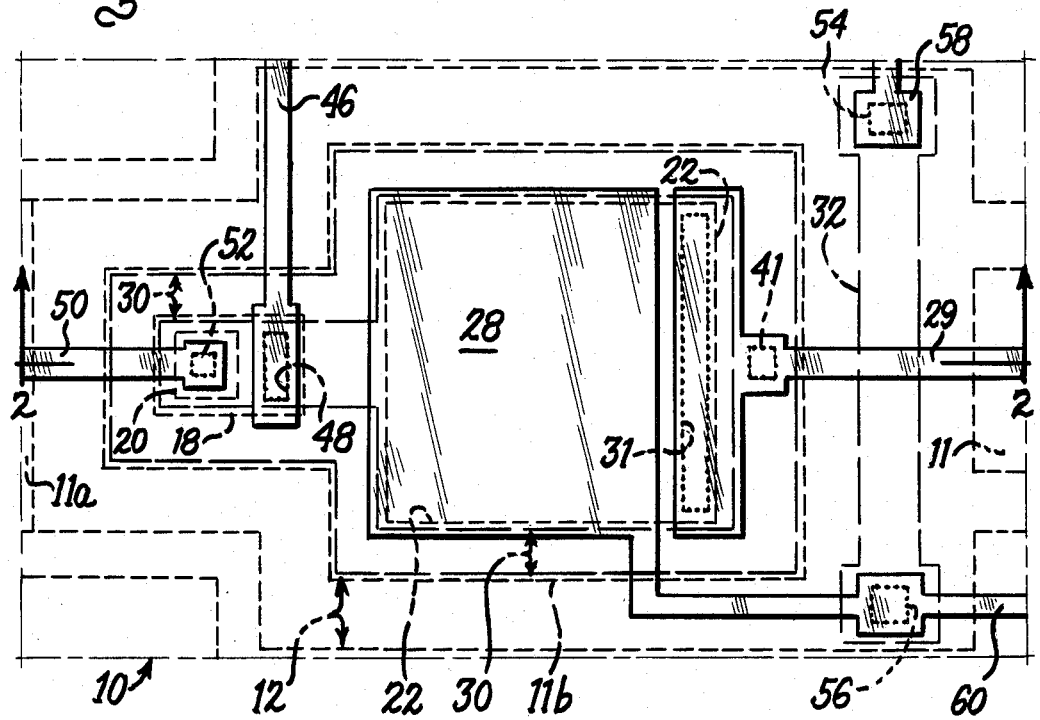
FIG. 1 shows in top view a portion of an integrated circuit of this invention.
Figure 2:
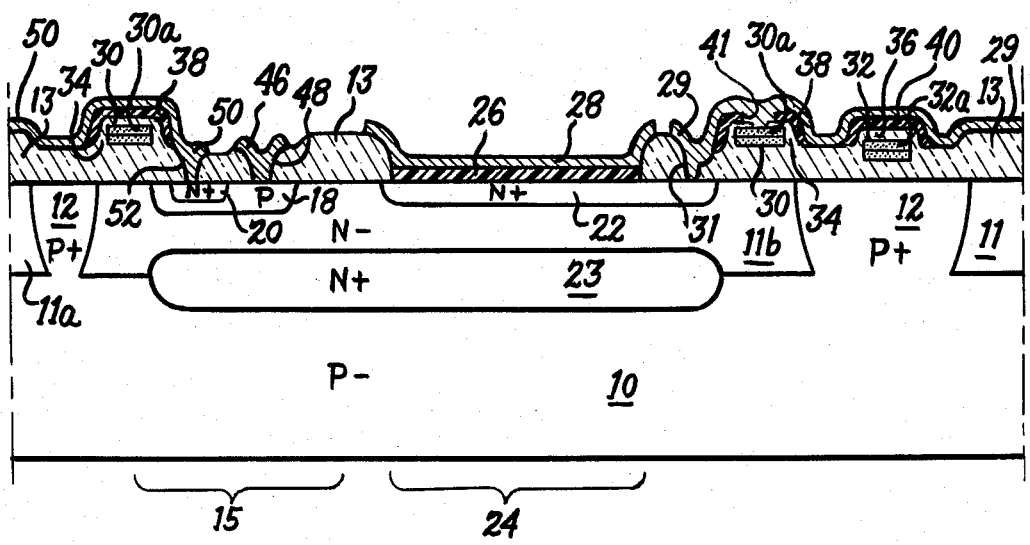
FIG. 2 shows in side sectional view taken in plane 2—2, the integrated circuit of FIG. 1.

In FIGS. 1 and 2 there are shown a number of components formed in a P-type crystalline silicon substrate 10. On the top face of the substrate 10 there has been grown an N-type epitaxial layer 11. The active components are formed for example in pocket regions, 11a and 11b of the epitaxial layer 11. These pocket regions are electrically isolated from one another by P-type isolation walls 12 which extend from the top or outer surface of the epitaxial layer 11 through the epitaxial layer to the substrate 10. A silicon dioxide layer 13 overlies the outer surface of epitaxial layer 11.

An NPN transistor 15 is formed in the epitaxial pocket 11b. This transistor 15 has a P-type base region 18 centrally located at the surface of the pocket 11b. An N-type emitter region 20 is formed within the base region 18 at the surface. A large area shallow region 22 contains a heavy concentration of N-type impurities, serving as a collector contact region for the NPN transistor 15. An N+buried layer 23 is formed at the interface between the N-pocket 11b and the P-substrate 10. Region 22 also serves as one electrode of a metal nitride semiconductor (MNS) capacitor 24. A silicon nitride layer 26 is formed over a major portion of the N+region 22 and becomes the dielectric layer of the MNS capacitor 24. The other capacitor electrode consists of an aluminum film 28 that overlies the dielectric siliccn ritride layer 26. An aluminum layer 29 extends through a hole 31 in the silicon dioxide layer 13 to the collector contact region 22. This aluminum layer 29 further extends over the field plate 30 and resistor 32 being separated therefrom in each case by a dual dielectric composed of silicon dioxide 34 or 36 and silicon nitride 38 or 40, but aluminum layer 29 also contacts the field plate 30 through the hole 41 in layers 34 and 38. A third aluminum layer 46 contacts the base region 18 through a hole 48 in the silicon dioxide layer 13 and crosses over the field plate 30 as seen in the top view of FIG. 1. A fourth aluminum layer 50 contacts the emitter region 20 through a hole 52 in the silicon dioxide layer 13.

The outer conductive layer portions 30a and 32a respectively of field plate 30 and resistor 32 contain ion plated impurities and the resistivity of these ion implanted polysilicon layers 30a and 32a are orders of magnitude higher than that of the aluminum layers 28, 46 and 50, so that small high-resistance resistors are made possible. As will be seen, the polysilicon field plate and resistor are formed simultaneously to save process steps, however, the field plate 30 is not required to carry a significant amount of current and therefore it's high resistance is not a disadvantage.

A silicon dioxide layer 36 covering resistor 32 has two holes 54 and 56 therein through which aluminum films 58 and 60 contact the conductive layer 32a.

The process by which the integrated circuit described above is manufactured includes the following steps performed in the order presented.

The P-type substrate 10 is oxidized to form a temporary silicon dioxide layer over all surfaces. Holes are opened in this layer in areas corresponding to the desired geometry and location of the N-type buried layer 23. N-type impurities, antimony, are deposited at the face of the substrate 10, through the holes. This silicon dioxide masking layer is them chemically stripped off. The epitaxial layer 11 is grown over the above mentioned substrate face by the well known method of heating and exposing the substrate 10 to a gaseous mixture containing a silicon precursor compound (silicon tetrachloride) and a gaseous precursor of N-type impurities (phosphine).

A silicon dioxide mask is formed over the surface of the epitaxial layer 11, and the P-type walls are preformed by a standard boron predeposition step through holes in the mask.

Similarly, after removing the last mentioned mask, boron is selectively diffused into the wafer to form the mildly doped P-type base region 18 and any diffused resistors that may be required in the circuit (not shown). In the same manner phosphorous is selectively diffused to form the shallow emitter region 20 as well as region 22. A short oxidation step is then performed to cover the emitter 20 and the other exposed N-type areas providing a layer of silicon dioxide 13 thereover.

A polysilicon layer is then formed over the silicon oxide covering the entire wafer surface by a standard low pressure chemical vapor deposition (CVD) step. Briefly, this step includes placing the wafer in a vacuum hot-wall furnace, drawing a vacuum, raising the temperature to about 625° C. and admitting silane ($SiH_4$) gas to a subatmospheric pressure. A polycrystalline layer is produced having a thickness of about 4000 angstroms. Boron ions are then implanted into the surface of the polysilicon, using a boron dopant such as elemental boron or $BF_2$ at 150 Kev. The resulting density of implanted boron ions at about 1500 angstroms from the outer surface of the polysilicon layer reaches a peak density of about $5 \times 18/cm_3$. The polysilicon sheet covering the whole of the surface of the epitaxial layer provides a highly efficient mask, preventing the penetration of the relatively large quantity ($5 \times 10^{14}$ ions/$cm^2$) of the bombarding ions during the ion implantation into the underlying oxide 13 and into the underlying devices. Additional information relating to this polysilicon resistor process is given in the patent to Miles et al U.S. Pat. No. 4,256,515 that is incorporated by reference herein. In this step the entire polysilicon sheet acquires an ion implanted top layer and thus, in subsequent steps removing some of the polysilicon to define the resistors and field plates in this sheet, the field plates (e.g. 30) of course also have an upper ion implanted layer (e.g. 30a). The field plates are therefore quite resistive but they carry little current, and their efficiency is not impaired. In general, whatever technique is used to impart conductivity to a polysilicon resistor (e.g. 32) is simultaneosly imparting conductivity to the polysilicon field plates (e.g. 30). This one unique step simplifies the process and leads to lower costs.

Then, by a standard photoresist and etching step, the polysilicon is selectively removed to define the geometries of the resistors, e.g. 32, which are about 10 microns wide but of various particular lengths to determine the final resistance values. In this same step the field plates (e.g. 30) are also defined. The resistors are preferably located where the underlying silicon oxide layer portions have substantial thickness, e.g. greater than about 0.5/micron, and are uniformly thick, such as over the base 18 or over the isolation wall 12, or over unaltered portions of the epitaxial layer 11b. The top surface of the polysilicon is oxidized in wet $O_2$ at 900° C. to form silicon dioxide layers 34 and 36.

The growth of a silicon dioxide layer having portions 34 and 36 over the polysilicon, consumes polysilicon and results in a final polysilicon layer thickness of about 3300 angstroms. About 90% of the implanted boron atoms lie within the outer 2000 angstroms of the upper stratum 30a of the polysilicon field plate 30 and the upper stratum 32a of the polysilicon resistor 32. Thus the polysilicon is kept thin, below 4000 angstroms, to obtain a well controlled high resistivity resistor body.

Note that from FIG. 2 the nitride capacitor dielectric 26 is directly adjacent to the silicon surface, whereas; the nitride insulation 38 is spaced away from the polysilicon field plate 30 by the silicon dioxide layer 34. The conventional method that may be used to build the capacitor to form the holes through which metal contacts are made to the polysilicon could be as follows:

A photo-resist mask is formed over the silicon dioxide layer 13 with an opening directly over the area that the capacitor will occupy and the silicon dioxide is etched away through that mask opening. In a standard low pressure chemical vapor deposition process, silicon nitride is deposited over the entire surface by the reaction of dichlorosilane and ammonia at about 800° C. under sub-atmospheric pressure.

A second photo-resist mask is formed over the nitride with large openings over areas to be contacted by metal, e.g. hole 41 where metal 29 contacts a silicon resistor 30. The exposed polysilicon, e.g. 38, is plasma etched to remove the silicon nitride and a small fraction of the silicon dioxide underneath.

In order to avoid severe undercutting of the silicon under the nitride, a subsequent wet etching step is employed to completely etch away the silicon dioxide at the metal contact sites. The second photo-resist layer is removed and a third photo-resist mask is provided having openings concentric with but smaller than the corresponding underlying holes in the silicon dioxide at the contact sites. Now, in the next step, the underlying silicon dioxide 34 is removed by a hydrofloric acid etch such that the holes through the silicon nitride and through underlying silicon dioxide are stepped as shown, for example, at hole 41 in FIG. 2.

However, we have found an alternative method that is simpler and preferred to the one described above for providing all the necessary holes in the silicon nitride and silicon dioxide layers. Returning again to the point in this process wherein a silicon dioxide layer 13 covers the entire epitaxial silicon surface, a first photo-resist layer is formed thereover with one opening over the area to be occupied by the capacitor and another opening at which metal will contact the field plate 30 and other holes at each other area of silicon to be contacted by metal. Through these mask openings the silicon dioxide material is removed by wet etching. The photo-resist layer is removed. A silicon nitride layer is deposited over the entire upper surface by the above-noted chemical vapor deposition process. The silicon nitride layer will now lie directly adjacent to silicon regions at which the capacitor and metal contacts are to be formed, e.g. regions 22, 30a, 20 and 18. This nitride layer is then exposed to steam at about 900° C. to form a very thin silicon dioxide film (not shown) of about 200 Å thickness.

A second photo-resist mask is formed over this thin silicon dioxide film with a larger size opening dirctly over each area of the polysilicon, e.g. 30, that is to be contacted by metal. That thin oxide is exposed to hydrofloric acid for about 20 seconds to provide openings therein corresponding to the openings in the photo-resist mask. The exposed silicon nitride is then plasma etched about half way through. The second photo-resist mask is removed and the remaining one-half of the silicon nitride is removed by boiling phosphoric acid. This combination of two partial nitride-etching steps avoids exposing the underlying silicon to the plasma which etches silicon very quickly and is difficult to control. This simpler method advantageously requires only two photographic steps whereas the first above described method requires three.

It is preferred to leave all the nitride except the holes therein through which the metal contracts the underlying circuit elements. It passivates the nitride most pertinent to the structure of the capacitor and that most pertinent to the high voltage capability of the metal/polysilicon cross-overs is shown to emphasize its use there and to simplify the drawing for better clarity.

Although this simply produced thin silicon dioxide film serves as an economical and satisfactory mask in a next step of plasma etching the underlying silicon nitride, a more substantial mask layer may be made instead by depositing around 1000 angstroms of silicon dioxide by a standard glass passivation step.

A sheet of aluminum is deposited by vacuum evaporation over the oxide (and overlying nitride where applicable) and through the holes (e.g. 31, 48 and 52) to contact the doped regions (e.g. 22, 18 and 20) at the desired areas. In a further photolithographic step, the aluminum is selectively removed to leave a network of conductors (e.g. 28, 46 and 50) to make the desired electrical connections. Then low temperature plasma-enhanced silicon nitride may be deposited over the entire wafer surface as a passivation layer (not shown).

The sheet resistivity of the polysilicon resistor and field plate is preferably about 200 ohms/square. Lower values lead to physically larger resistors that occupy more chip area. Higher values are more difficult to make to a predetermined target value and are less stable. It has been determined experimentally that with a 2000 Å thick silicon nitride layer (the silicon dioxide layer over the polysilicon is about the same thickness) and with a field plate resistivity of 2000 ohms/square, an integrated circuit of this invention can reliably operate at voltages over 100 volts. Thus, not only are the MNS capacitor and dual insulation layer of silicon nitride and oxide between metal and polysilicon conductors capable of operation to a greater than 100 volts without breakdown, but it has been demonstrated that the high resistivity field plate is also effective in preventing surface inversion when operated at these high voltages.

When tight tolerance resistor values are not required the polysilicon resistor bodies may be doped by heating in a dopant containing gaseous atmosphere or by another alternate standard means other than the partial implantation step described above. In any case, it is a basic aim of this invention to simultaneously impart conductivity to both the resistor and the field plate, and these both will exhibit the same sheet resistance and the same dopant profile.

As has been noted, the silicon nitride layer preferably extends over the entire silicon dioxide 13 surface. It is intended that stepped metal contact holes to other transistors, resistors and field plates (not shown) on the same chip be made simultaneously through the silicon dioxide and overlying silicon nitride by the same advantageous process steps described above for the metal contact holes in the portion of the chip illustrated in FIGS. 1 and 2.

What is claimed is:
1. A high voltage integrated circuit comprising
a silicon crystal substrate of P-type,
an epitaxial layer of N-type having been grown over a surface of said substrate,
an annular P-type isolation wall extending through said epitaxial layer and enclosing a pocket of said epitaxial layer therein, a mildly doped P-typed region in a surface portion of said pocket that may serve as a part of an electronic component formed in said-pocket, a first silicon dioxide layer over said epitaxial layer, a high resistivity doped polysilicon field plate in the form of a strip over said pocket on a first surface portion of said first silicon dioxide layer, said field plate strip encircling said component and being positioned just inside the portion of said isolation wall which defines said pocket, a high resistivity doped polysilicon resistor body in the form of a strip on a second surface portion of said first polysilicon dioxide layer, the dopant profile in and the sheet resistivity of said field plate being identical to that of said resistor, a second silicon dioxide layer over said polysilicon field plate and resistor, a silicon nitride layer over said second silicon dioxide layer to provide a dual second-silicon-dioxide/silicon-nitride insulation over said field plate and said resistor, a metal film conductor contacting a portion of said P-type region through a hole provided in said first silicon dioxide layer, said metal conductor extending from said P-type region outward and over one area of said dual insulation of said polysilicon field plate, another metal conductor contacting said N-type epitaxial pocket through a hole provided therefor in said first silicon dioxide layer and contacting said field plate through a hole provided therefor in another area of said dual insulation.

2. The high voltage integrated circuit of claim 1 additionally comprising an N-type region within said P-type region to form a vertical NPN transistor in said pocket wherein said P-type region may serve as the base of said transistor.

3. The high voltage integrated circuit of claim 1 wherein said second silicon nitride layer is separated into at least two non-continuous portions which overlie said polysilicon field plate and resistor, respectively.

4. A high voltage integrated circuit comprising a silicon substrate lightly doped with P-type impurities, and epitaxial layer lightly doped with N-type impurities having been grown over said P-type substrate. heavily doped P-type isolation walls forming a plurality of PN junction isolated N-type pockets in said epitaxial layer, at least one of said pockets having a bipolar transistor formed therein, a first silicon dioxide layer over said epitaxial layer, an annular polysilicon field plate in the form of a strip over said pocket on a first surface portion of said first silicon dioxide layer that is positioned just inside the portion of said isolation wall which defines said at least one pocket, a polysilicon resistor body in the form of a strip on a second surface portion of said first silicon dioxide layer, a second silicon dioxide layer over said polysilicon field plate and resistor, a silicon nitride layer over said second silicon dioxide layer to provide a dual second-silicon-dioxide/silicon-nitride insulation over said field plate and said resistor, metal film conductors contacting portions respectively of said transistor through holes provided therefor in said first silicon dioxide layer, said metal conductors extending from said transistor outward and over said dual insulation of said polysilicon field plate, another metal conductor contacting said at least one N-type epitaxial pocket through a hole provided therefor in said first silicon dioxide layer and contacting said field plate through a hole provided therefor in another portion of said dual insulation.

5. The high voltage integrated circuit of claim 4 additionally comprising a shallow N-type region formed in a certain one of said pockets and a silicon nitride film formed directly on said shallow N-type region within an opening provided therefor in said first silicon dioxide layer, and a metal film overlying said silicon nitride film to form a capacitor wherein said nitride film is the capacitor dielectric.

6. The high voltage integrated circuit of claim 1 wherein the thickness of said silicon nitride layer is about 2000 angstroms or more.

7. The high voltage integrated circuit of claim 6 wherein the thickness of said second silicon dioxide layer is about 2000 angstroms or greater.

8. The high voltage integrated circuit of claim 1 wherein said dual second-silicon-dioxide/silicon-nitride insulation has a breakdown voltage of at least 100 volts.

9. The high voltage integrated circuit of claim 1 wherein said dopant profile in said polysilicon field plate and resistor has a high dopant concentration near the outer surface thereof and a near zero dopant concentration near the inner surface thereof.

10. The high voltage integrated circuit of claim 1 wherein said polysilicon resistor body and field plate have a resistivity greater than 200 ohms per square.

11. The high voltage integrated circuit of claim 1 wherein said high resistivity polysilicon field plate and resistor haveing been doped by ion implantation only part way through said polysilicon strips.

* * * * *